United States Patent [19]

Stacy

[11] Patent Number: 4,721,934
[45] Date of Patent: Jan. 26, 1988

[54] AXIAL STRAP SUSPENSION SYSTEM FOR A MAGNETIC RESONANCE MAGNET
[75] Inventor: Len E. Stacy, Florence, S.C.
[73] Assignee: General Electric Company, Schenectady, N.Y.
[21] Appl. No.: 33,293
[22] Filed: Apr. 2, 1987
[51] Int. Cl.$^4$ .............................................. H01F 5/00
[52] U.S. Cl. .............................. 335/300; 174/15 CA; 335/216
[58] Field of Search ............... 324/318, 319, 320, 321; 335/216, 299, 300; 174/15 CA, 15 S

[56] References Cited
U.S. PATENT DOCUMENTS

| | | | |
|---|---|---|---|
| 4,029,893 | 6/1977 | Roger | 174/15 CA |
| 4,502,296 | 3/1985 | Ogata et al. | 174/15 CA X |
| 4,516,405 | 5/1985 | Laskaris | 62/55 |
| 4,571,568 | 2/1986 | Grangereau | 335/299 |

Primary Examiner—George Harris
Attorney, Agent, or Firm—William H. Steinberg; James C. Davis, Jr.; Paul R. Webb, II

[57] ABSTRACT

A cryostat comprising an outer closed cylindrical vacuum vessel and a helium vessel is situated inside the vacuum vessel. The helium vessel has on its outside surface four radially extending trunnions situated on a horizontal plane passing through the center of the helium vessel. The trunnions are symmetrically spaced on either side of the helium vessel, about the helium vessel's axial midplane. Four straps have one end of each of the strap looping about a respective one of the four trunnions. The other end of each of the straps is rotatably secured to the circular end faces of the vacuum vessel, with the two straps from the trunnions closest to an end face secured to that end face.

11 Claims, 18 Drawing Figures

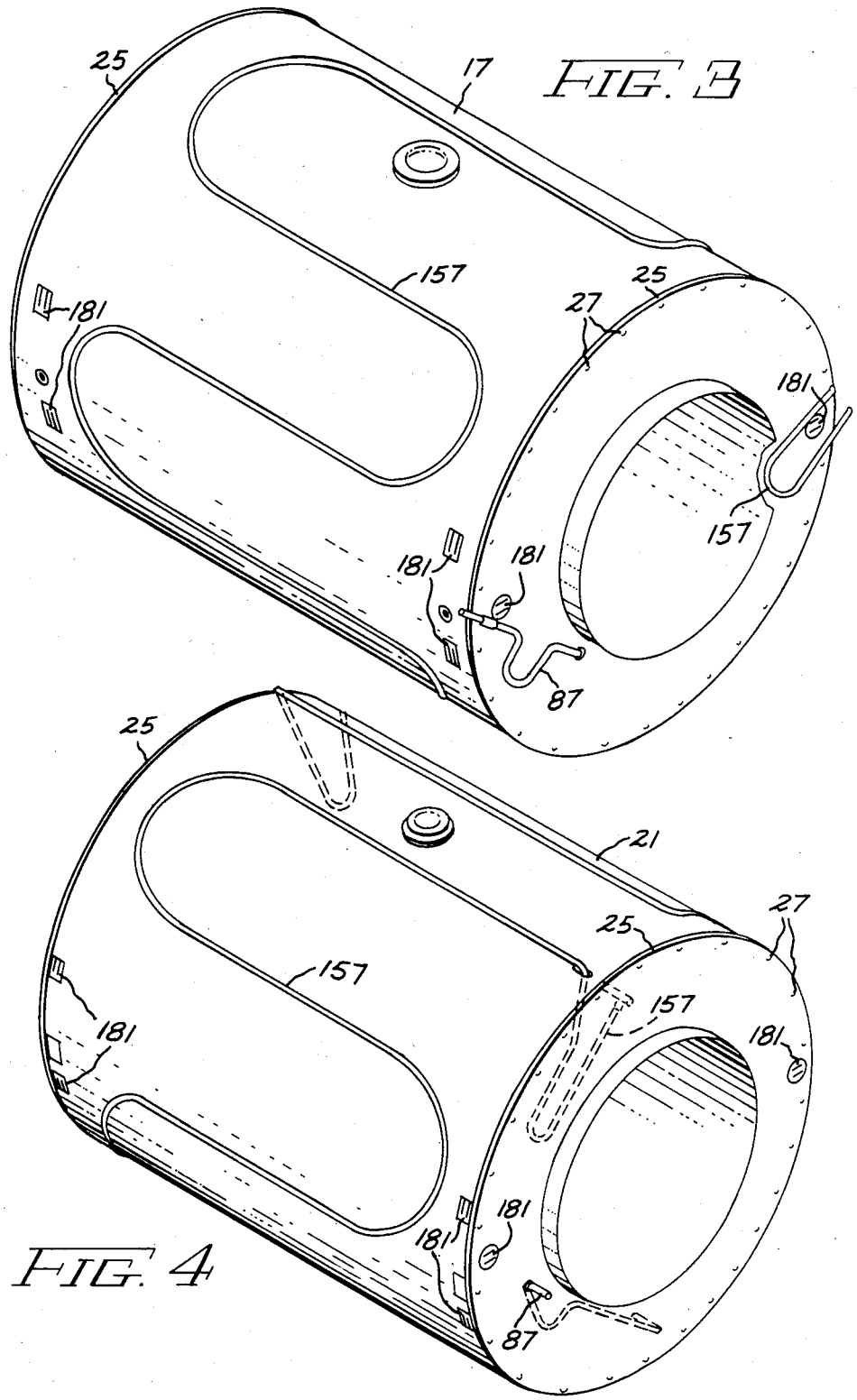

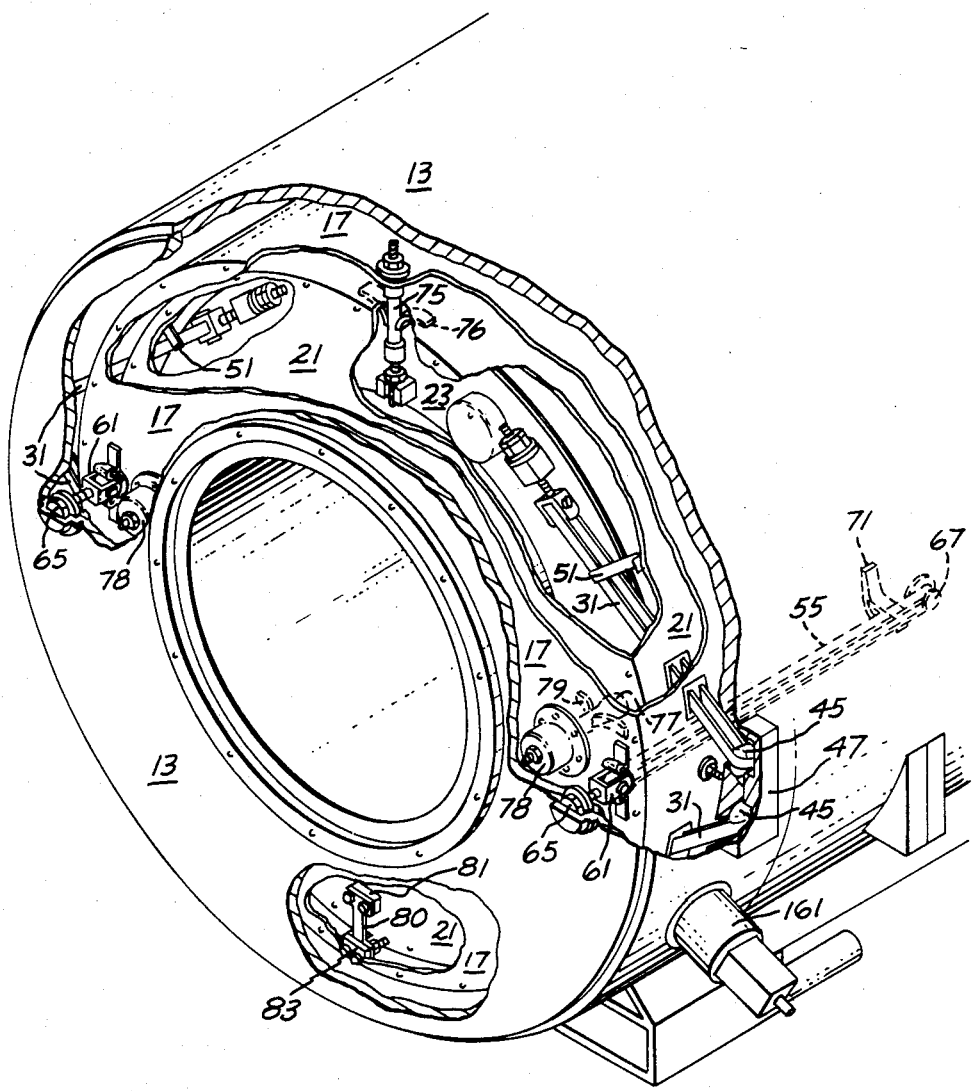

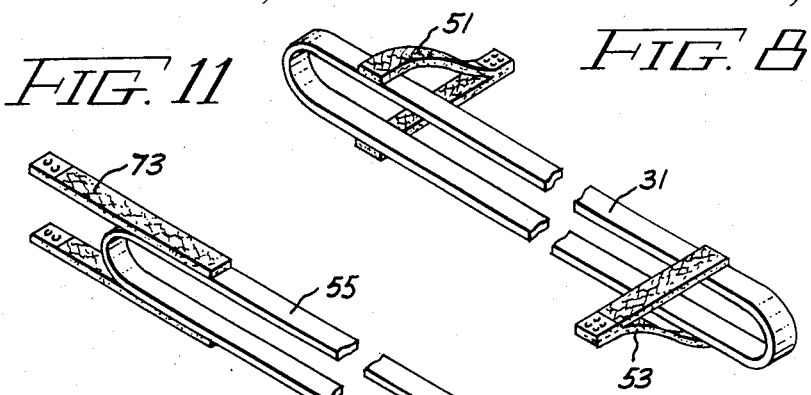
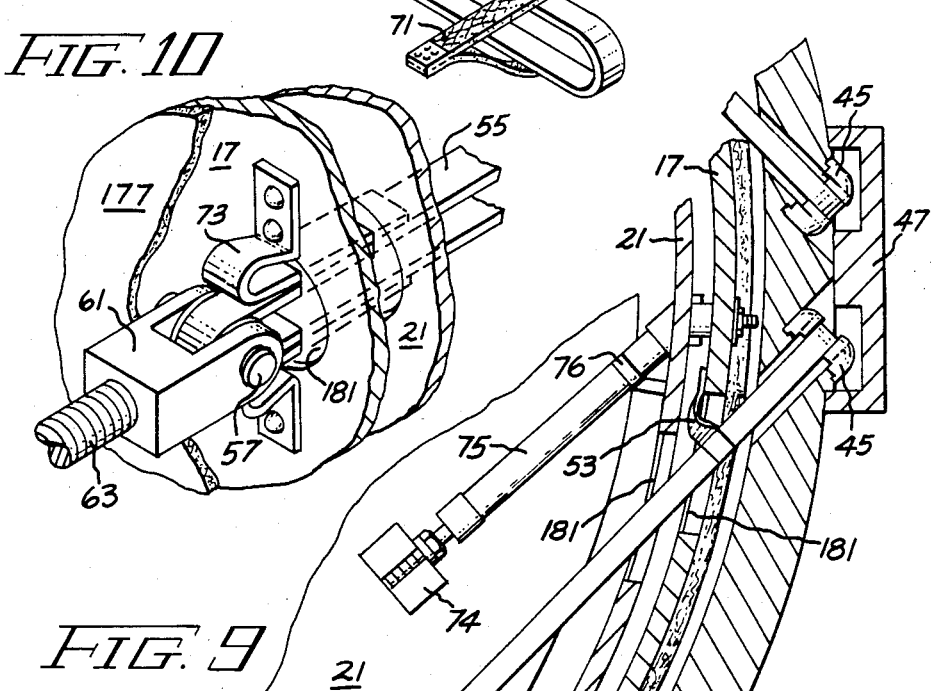
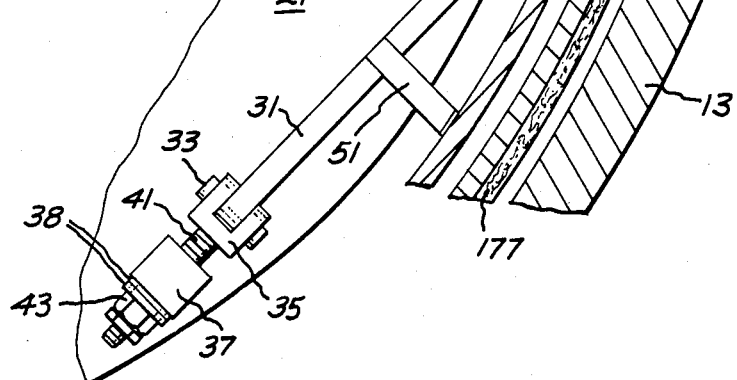

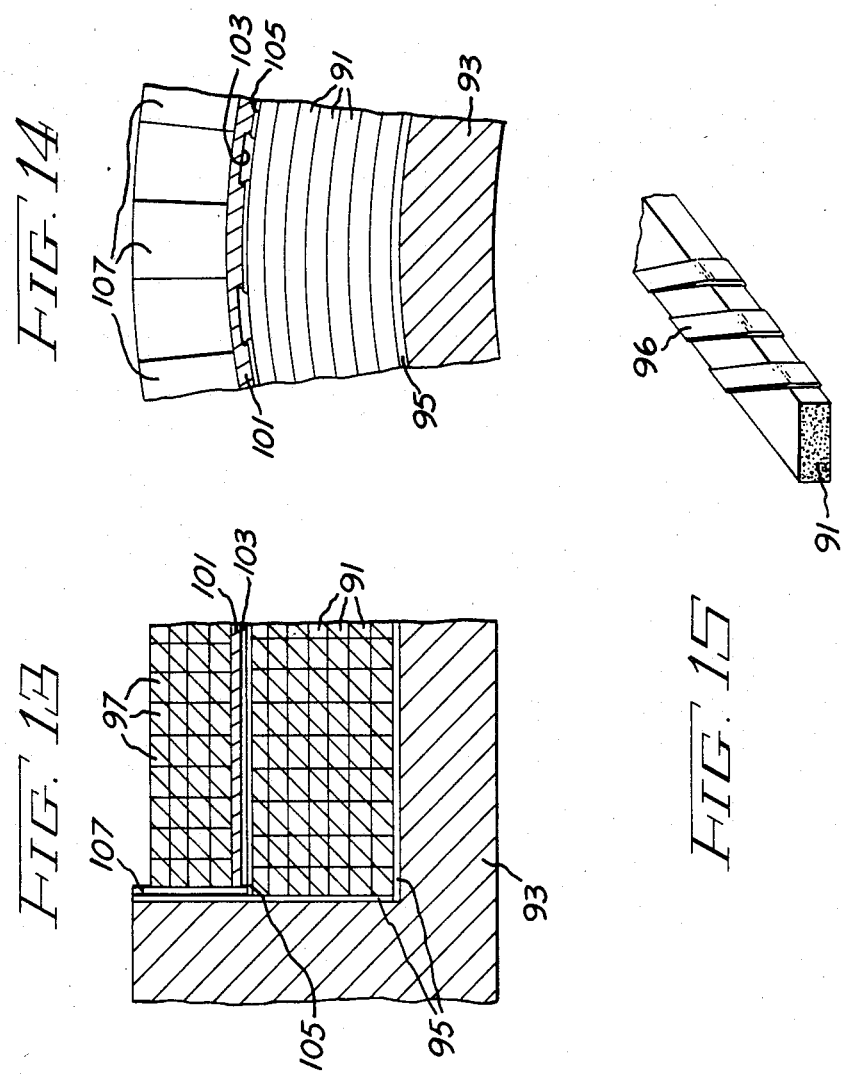

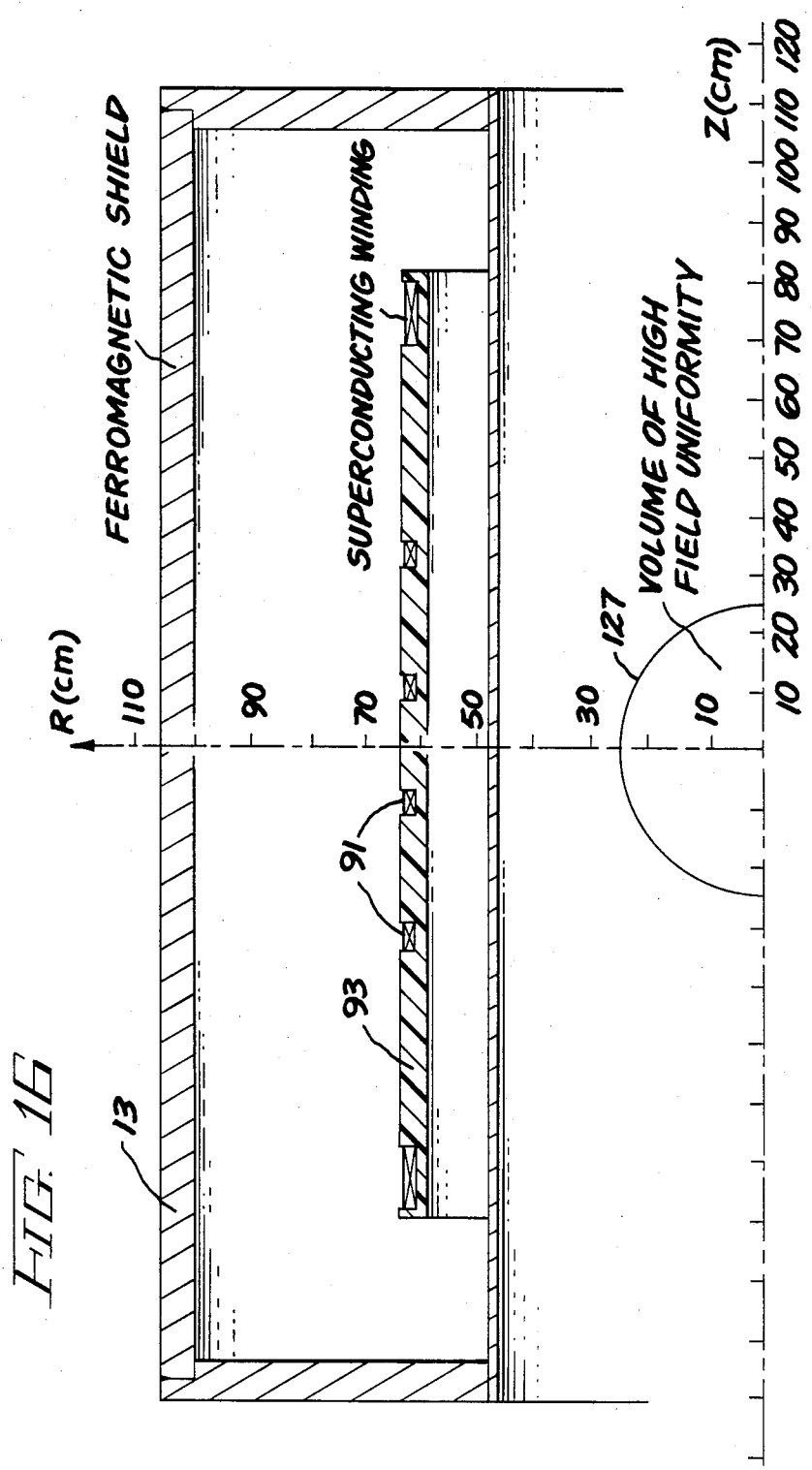

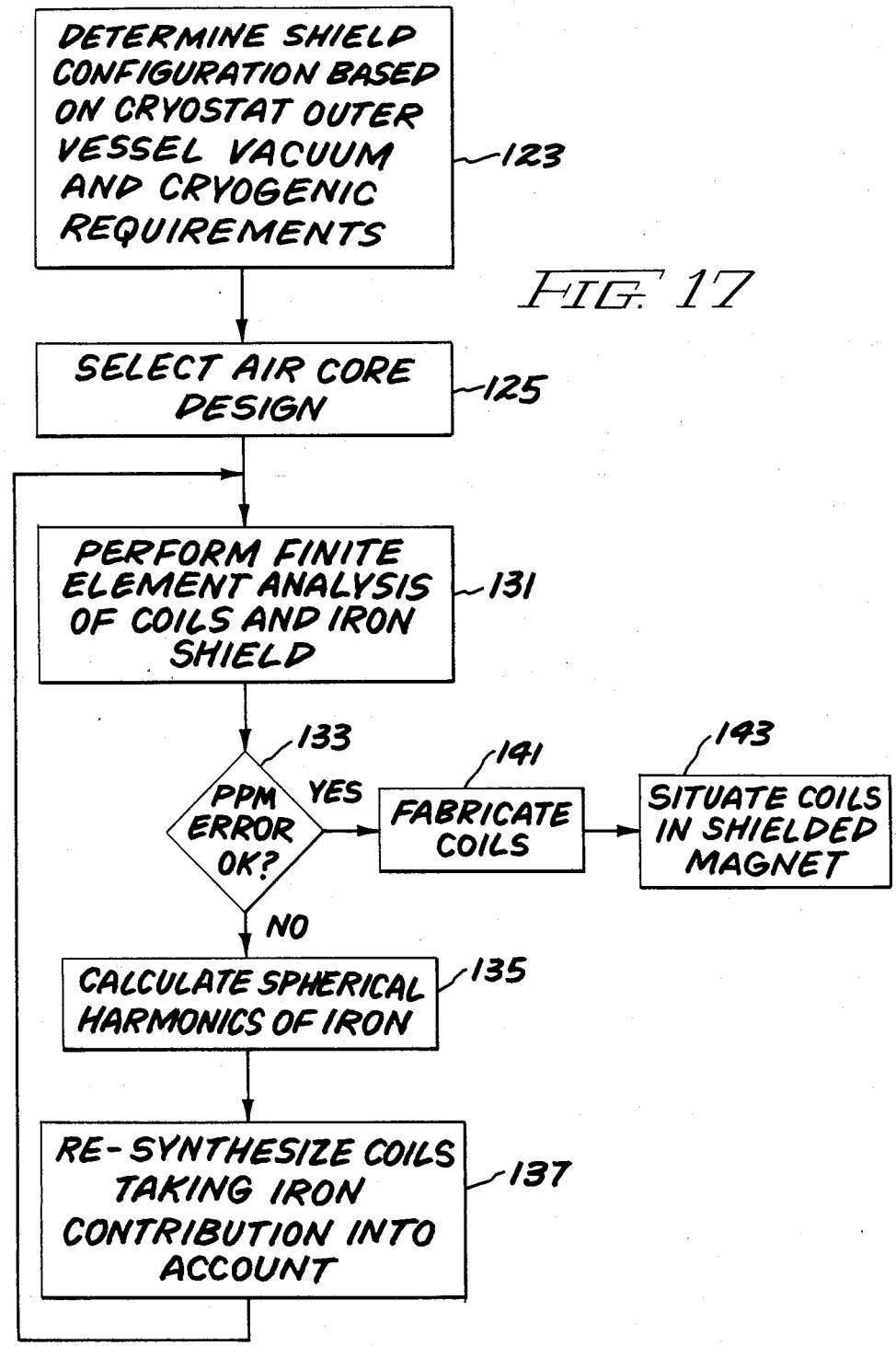

4,721,934

AXIAL STRAP SUSPENSION SYSTEM FOR A MAGNETIC RESONANCE MAGNET

CROSS REFERENCE TO RELATED APPLICATIONS

The present application is related to copending applications, Ser. No. 033,326 "Superconducting Magnetic Resonance Magnet and Method of Making Same", Ser. No. 033,423, "Radial Cryostat Suspension System", Ser. No. 033,424, "Thermal Interface for Interconnecting a Cryocooler and a Magnetic Resonance Imaging Cryostat", Ser. No. 033,329, "A Shield Suspension System for Magnetic Resonance Cryostat", Ser. No. 033,330, "Integral Shield For MR Magnet and Method of Making Same".

BACKGROUND OF THE INVENTION

The present invention relates to an axial strap support for a cryostat containing a superconducting magnetic resonance imaging magnet.

A cryostat is a containment vessel designed to thermally isolate its interior from exterior ambient temperature conditions. To achieve the desired degree of thermal isolation, multiple nested vessels may be employed with each vessel functioning at one of a sequence of temperatures, with the interior temperature of the innermost vessel being the coldest. The inner vessels need to be supported spaced apart from one another with sufficient rigidity to withstand shipping loads yet have as few physical connections between the interior vessels and the external vessels to minimize heat leak.

One approach for an axial positioner uses three concentric cylinders with one end of the inner positioner cylinder connected to an inner vessel and one end of the outer positioner cylinder connected to the outer vessel. The intermediate positioner cylinder connected the other ends of the inner and outer cylinder ends increasing the effective length of the thermal path between the two vessels. This approach has the drawbacks of being composed of a large number of parts, the bonded joints connecting the positioner cylinders together are process sensitive and finally it is not very rugged or forgiving of assembly errors or tolerance stackings.

It is an object of the present invention to provide an axial strap suspension which is sufficiently strong to withstand shipping loads and has few parts.

It is another object of the present invention to provide an axial strap suspension which accommodates manufacturing tolerance stackup error and provides improved fatigue loading cycle performance.

SUMMARY OF THE INVENTION

In one aspect of the present invention, a cryostat comprising an outer closed cylindrical vacuum vessel and a helium vessel situated inside the vacuum vessel are provided. The helium vessel has on its outside surface four radially extending trunnions situated on a horizontal plane passing through the center of the helium vessel. The trunnions are symmetrically spaced on either side of the helium vessel, about the helium vessel's axial midplane. Four straps each have one of their ends looped about a respective one of the four trunnions. The other end of each of the straps is rotatably secured to the circular end faces of the vacuum vessel, with the two straps from the trunnions closest to an end face secured to that end face.

BRIEF DESCRIPTION OF THE DRAWING

While the specification concludes with claims particular pointing out and distinctly claiming the present invention, objects and advantages of the invention can be more readily ascertained from the following description of a preferred embodiment when used in conjunction with the accompanying drawing in which:

FIG. 3 is an isometric view of an 80K radiant heat shield of the magnetic resonance imaging cryostat;

FIG. 4 is an isometric view of a 20K heat shield of the magnetic resonance imaging cryostat;

FIG. 7 is a partial cut away isometric of the other end of the magnetic resonance imaging cryostat of FIG. 1;

FIG. 8 is an isometric view of a radial support strap with heat stationing braided cables in accordance with the present invention;

FIG. 9 is a partial isometric cut away view showing the attachment of the heat stationing cable and the attachment of one end of a radial suspension strap in the magnetic resonance cryostat;

FIG. 10 is a partial sectional view of the cryostat showing part of the axial support system;

FIG. 11 is an isometric view of an axial support strap with two heat stationing braided cables in accordance with the present invention;

FIG. 13 is a partial sectional axial view of the magnet winding support form with the superconductor wire and the stainless steel overwrap wire in place;

FIG. 14 is a partial sectional radial view of the magnet winding support form with superconductor wire but without the stainless steel wire overwrap in place;

FIG. 15 is an isometric view of a section of superconductor wire with a partial tape overwrap;

FIG. 16 is a section of the cryostat showing the relative position of the vacuum vessel which serves as an integral shield, the magnet winding and the volume of the desired high field uniformity;

FIG. 17 is a block diagram showing the steps in making a MR magnet with an integral shield.

DETAILED DESCRIPTION OF THE INVENTION

Figure 1:
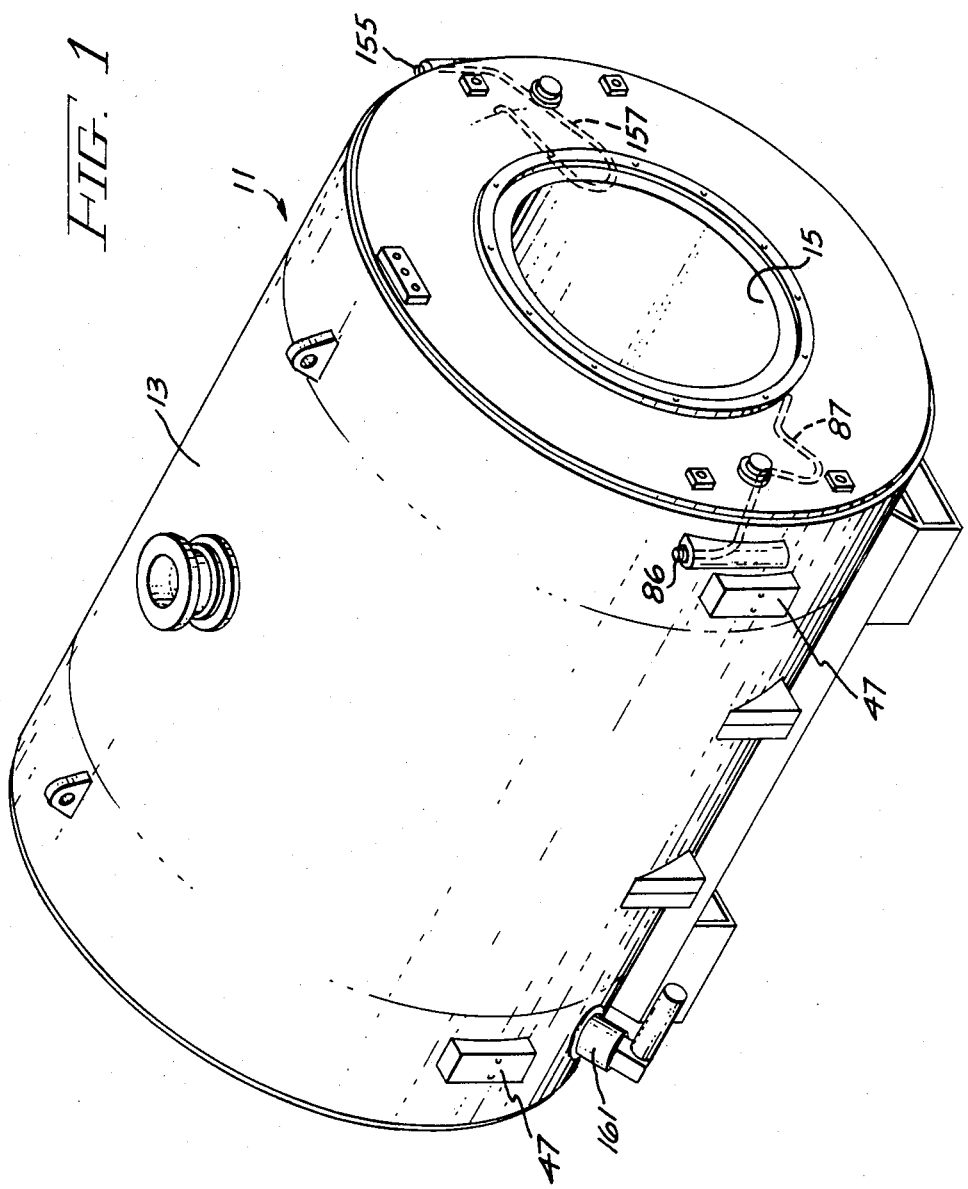
FIG. 1 is an isometric view of a magnetic resonance imaging cryostat in accordance with the present invention.
Figure 2:
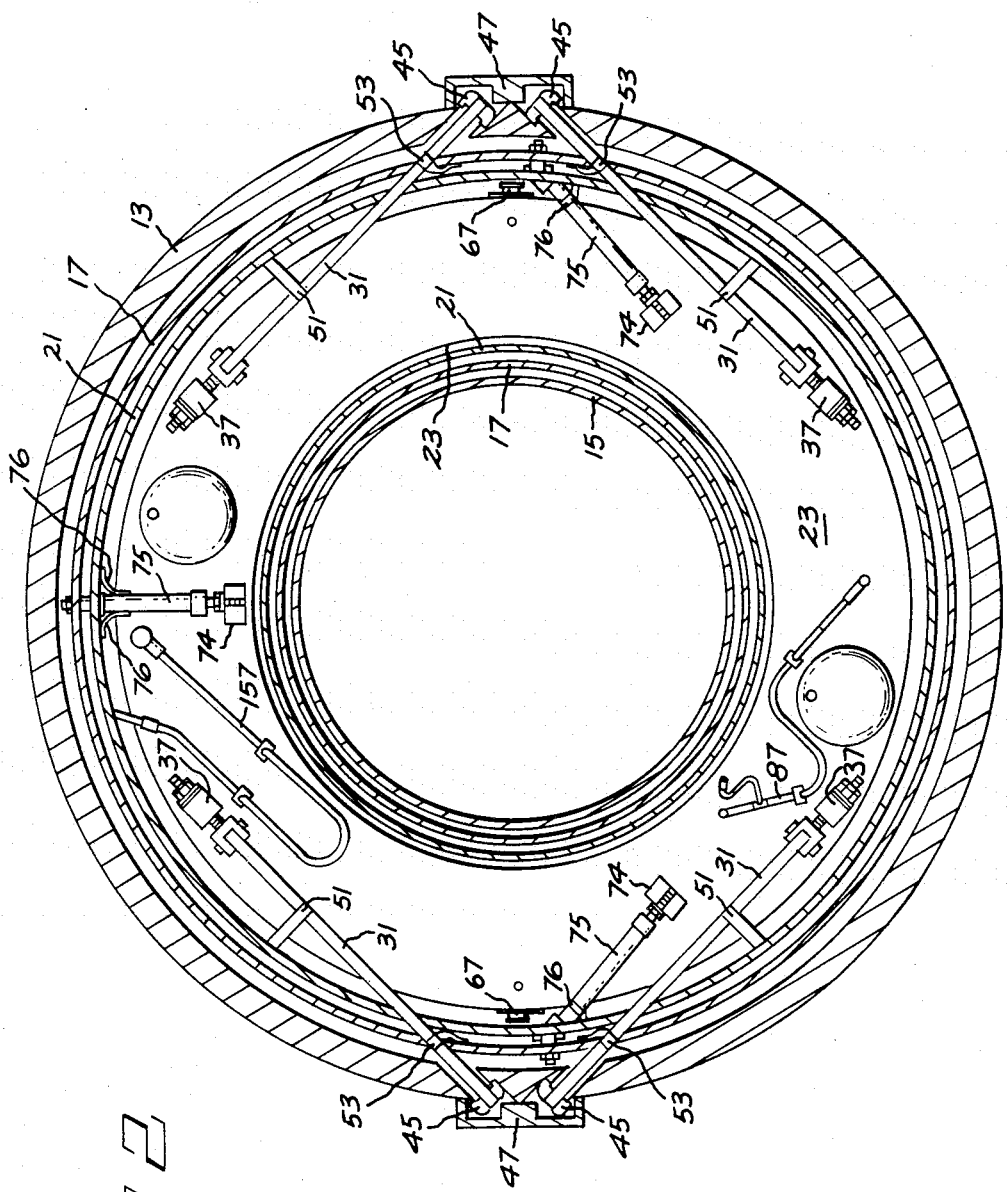
FIG. 2 is a sectional end view of FIG. 1.

Referring now to the drawing wherein like numerals refer to like elements throughout and particularly FIGS. 1 and 2 thereof, a magnetic resonance cryostat 11 is shown. An outer closed cylindrical vacuum vessel 13 having an axial enclosed bore 15, surrounds an 80K closed cylindrical heat shield 17. A 20K closed cylindrical heat shield 21 and a closed cylindrical helium vessel 23 containing a magnet are nested inside the 80K shield. The 80K shield, 20K shield and helium vessel each have an enclosed axial bore extending therethrough. The 80K and 20K shields are each fabricated from heat conductive nonmagnetic material such as aluminum and are shown in full in FIGS. 3 and 4, respectively. The circular end faces of the shields are secured by bolts 27 to rings of aluminum 25 which are welded to the ends of the cylindrical shields, as seen in FIGS. 3 and 4. The helium vessel 23 is made of nonmagnetic heat conductive material such as aluminum and is shown in full in FIG. 5. The circular end faces of the helium vessel are welded in place on the cylinder. The vacuum vessel 13, which also serves as a ferromagnetic shield, is fabricated of mild rolled steel plate with the axial bore portion 15 comprising nonmagnetic stainless steel. Ingot iron can alternatively be used in place of the mild rolled steel plate. The rolled steel plate end faces of the vacuum vessel are welded in place to the stainless steel bore 15 and rolled steel plate cylindrical shell. All welds of the steel in the ferromagnetic shield must be vacuum leak tight. The shield inside surface is treated with rust inhibitors to reduce outgassing in the vacuum. Effective rust inhibitor coatings which reduce outgassing are Bond RI 1235 or Contec available from Sealed Air Corporation. Alternatively, in an unshielded embodiment, the entire vacuum vessel can be fabricated from nonmagnetic stainless steel.

Referring now to FIGS. 2, 6, 7 and 9, the radial support system of the helium vessel inside the cryostat will be described. The helium vessel 23 is supported radially in the vacuum vessel 13 by eight fiber reinforced plastic composite support straps 31, with four straps situated at either circular face of the helium vessel 23. Required thermal and fatigue life performance of the fiber reinforced plastic composite straps is obtained by selecting a unidirectional fiber dominated composite with 60% volume fraction of fibers in an epoxy matrix. The fibers should have high strength with a high modulus of elasticity and have low thermal conductivity at cryogenic temperatures. Suitable fiber materials for this application are alumina, graphite, silicone carbide and S-glass. The straps in the preferred embodiment are formed as elongated loops of S-2 fiberglass impregnated with SCI-REZ-081 glass epoxy material available from Structural Composites Industries, Calif. The four straps 31 at either end of the helium vessel lie in the same plane and are parallel to the circular end faces of the cylindrical vacuum vessel 13. The straps on either end of the helium vessel are located symmetrically about the midplane of the outer vacuum vessel. Each strap extends from a pin 33 held by a clevis 35. The clevis 35 is secured by a threaded rod 41 to a block 37 welded to the face of the helium vessel 21. One end of the threaded rod 41 is threaded into the clevis 35 and the other end passes through an aperture in the block 37 and is secured by a nut 43 and a jam nut. The other end of the strap 31 passes over a spherical support 45 which is pivotally mounted in a recess in the vacuum vessel 13. The spherical support pivots to properly align the strap thereby compensating for variations in the fabricated parts. This proper alignment ensures that the strap is uniformly supported across its width, thereby producing maximum fatigue life. The clevis, threaded rod, and spherical support are fabricated from nonmagnetic material preferably stainless steel. The block 37 is fabricated from nonmagnetic material preferably aluminum. A cover 47 of mild steel is welded over the openings in the vacuum vessel to maintain vacuum conditions. Each of the four straps 31 on each end of the helium vessel form a 45° angle with a horizontal plane. On each circular end of the helium vessel, two straps are anchored near the top of the helium vessel and two near the bottom. The top straps extend at a 45° angle below a horizontal plane and the bottom straps extend at a 45° angle above a horizontal plane. One of the bottom and one of the top straps on one face of the helium vessel extend through the vacuum vessel near the horizontal midplane on one side and the other of the bottom and top straps on one face of the helium vessel extend through the vacuum vessel near the horizontal plane on the opposite side. None of the straps cross one another. The straps 31 also pass through apertures in the 20K and 80K shields.

The straps 31 are each heat stationed to the 20K and 80K shields by braided copper cables 51 and 53, respectively, to intercept conduction heat transferred from the vacuum vessel 13 which is at room temperature. One of the support straps 31 with the heat stationing straps 51 and 53 is shown in FIG. 8. The heat stationing straps 51 and 53 are affixed to opposite sides of the loop of the composite straps 31 by heat conductive epoxy at locations along the length of the strap 31. The straps 51 and 53 are secured to the shields by rivets extending through holes in the braid. Adjustment of nut 43 located at block 37 varies the tension in the straps. The symmetric arrangement of the radial supports assures that the helium vessel's axial center line does not move relative to the axial centerline of the outer vacuum vessel when the outer vacuum vessel is subjected to small temperature changes. This is important since the outer vacuum vessel provides self-shielding to the magnet in the helium vessel and relative motion between the two centerlines cannot be tolerated if uniform magnetic field homogeneity in the bore of the magnet needed for imaging is to be maintained.

Figure 6:
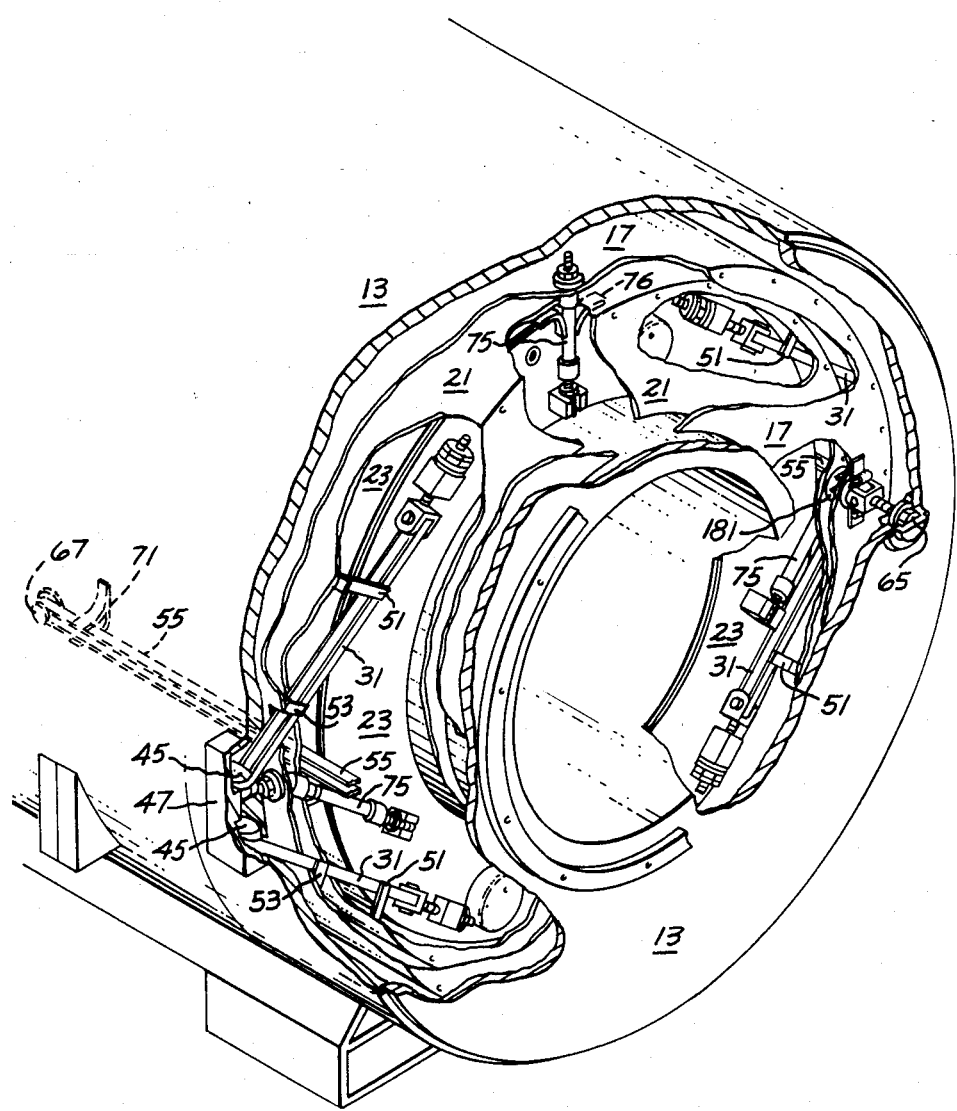
FIG. 6 is a partial cut away isometric of one end of the magnetic resonance imaging cryostat of FIG. 1.

Referring now to FIGS. 6, 7 and 10, the axial support system of the helium vessel 23 inside the cryostat will be described. The helium vessel 23 is supported axially from the vacuum vessel 13 by four composite straps 55 formed as elongated loops of the same material but half as wide as the straps used to radially support the helium vessel. The straps 55 extend along the horizontal plane passing through the center of the cylindrical helium vessel, One end of each of the four straps 55 is supported by one of four pins 57 about which the straps 55 pass. Each pin is held by a clevis 61 which in turn is secured to a threaded rod 63. The threaded rod for two of the straps passes through one of the circular faces of the vacuum vessel and a nut 65 and jam nut (not shown) are threaded on the threaded rod 63 for adjusting the tension. The threaded rods from the other two straps extend through the other circular face of the vacuum vessel and are similarly secured. The straps 55 are connected to the helium vessel by looping the other end of each of the straps over one of the four trunnions with capping flanges 67 extending radially from the helium vessel. The trunnions 67 are located on the horizontal plane passing through the center of the cylinder and the two trunnions on each side of the cylinder midplane are symmetrically located in the axial direction. The axial position of the trunnions on either side of the center plane is determined by the amount of preload which is desired to apply to the strap by the thermal contraction of the helium vessel after the strap is installed. The further the trunnion is situated from the center line, the greater the contraction towards the center of the cylinder. The support straps 55 pass through apertures in the 20K and 80K shields and are heat stationed to the 20K and 80K shields by braided copper cables 71 and 73, respectively. The straps 71 and 73 are attached to opposite sides of the loop of the composite straps 55 at locations along the length of the straps. An axial support strap 55 with the heat stationing straps 71 and 73 is shown in FIG. 11. The heat stationing straps are affixed to the shields by rivets. The clevis 61 and trunnion 67 connections allow rotation of the strap 55 which compensates for manufacturing stackup variations.

The 80K shield 17 is supported from the helium vessel 23 in the radial direction by tubular struts 75 which are under compression and are secured to aluminum blocks 74 welded to the helium vessel at three locations on each circular face of the helium vessel. The struts have internal threads on either end with threaded rods extending therefrom. One strut extends vertically from the top portion of each face passing through the 20K shield and is secured to the 80K shield. Two other struts 75 are mounted on each of the faces of the helium vessel equally spaced from each other and the vertical strut and extend through the 20K shield and are secured to the 80K shield. The two struts make approximately a 45° angle with the horizontal and are affixed to the 80K shield just below the horizontal plane passing through the center of the shield. Each of the struts 75 is heat stationed to the 20K shield by a braided cable 76. The 80K shield is supported in the axial direction by two struts 77 located on only one end of the vessel as shown in FIG. 7. The strut is secured by a threaded rod to the circular face of the helium vessel and extends through the 20K shield and is secured to an axial support cover 78 by two nuts which thread onto a threaded rod extending from the end of the strut 77. Strut 77 is heat stationed to the 20K shield by braided cable 79. All the struts 75 and 77 comprise nonmagnetic material with low heat conductivity preferably G-10CR thin wall fiberglass tubing having internal threads on both ends.

Referring now to FIG. 7, the 20K shield 21 is supported from the 80K shield 17 by six nonmagnetic supports with low heat conductivity, preferably comprising G10 fiberglass plates 80 of 0/90 glass epoxy laminate with mounting holes at the top and bottom. Each plate is secured by nuts and bolts through an aluminum block 81 extending out from the circular face of the 20K shield. The other end of the plate is secured through a spacer block 83 on the inside of the 80K shield. The blocks 81 and 83 assure that the plate 80 extends parallel to the circular faces of the shields. The three plates 80 on each end are equally spaced circumferentially from one another with one of the plate extending vertically from the bottom of the 80K shield to the bottom of the 20K shield shown in FIG. 7. The radial length of the plate between the bolt holes is adjusted to compensate for the relative shrinkage of the aluminum 20K and 80K shields when cooled to reduce the stress on the plates. The plates are sufficiently thick to provide axial support.

Two-piece misalignment washers 38 are used at each threaded attachment joint for straps 31 and 55, and struts 75. These washers are fabricated from nonmagnetic material preferably stainless steel, and compensate for misalignments produced by variations in fabricated parts. These washers ensure that the straps and struts are properly aligned and at installation thereby eliminating potentially damaging loads in the supports at assembly. The washers allow up to five degrees of rotation.

Heat stationing of the composite support straps 31 and 55 and struts 75 and 77 allows the temperature distribution along the composite straps and struts to be changed. Since heat conductivity of the straps and struts is less at lower temperatures, providing a lower temperature over a longer length of the strap and strut by heat stationing a portion of the strap and strut at a lower temperature than it would otherwise be, the heat conducted through the strap and strut is reduced. Further reduction of the heat conducted to the helium vessel is accomplished by intercepting the heat and diverting it to the shields.

Figure 5:
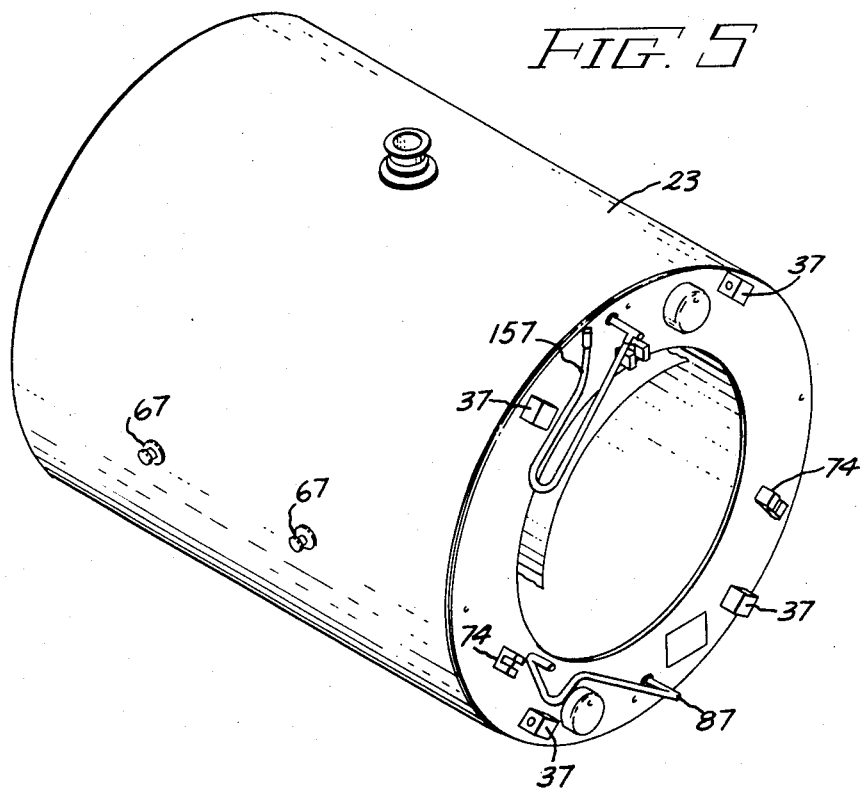
FIG. 5 is an isometric view of the helium vessel of the magnetic resonance imaging cryostat.
Figure 12:
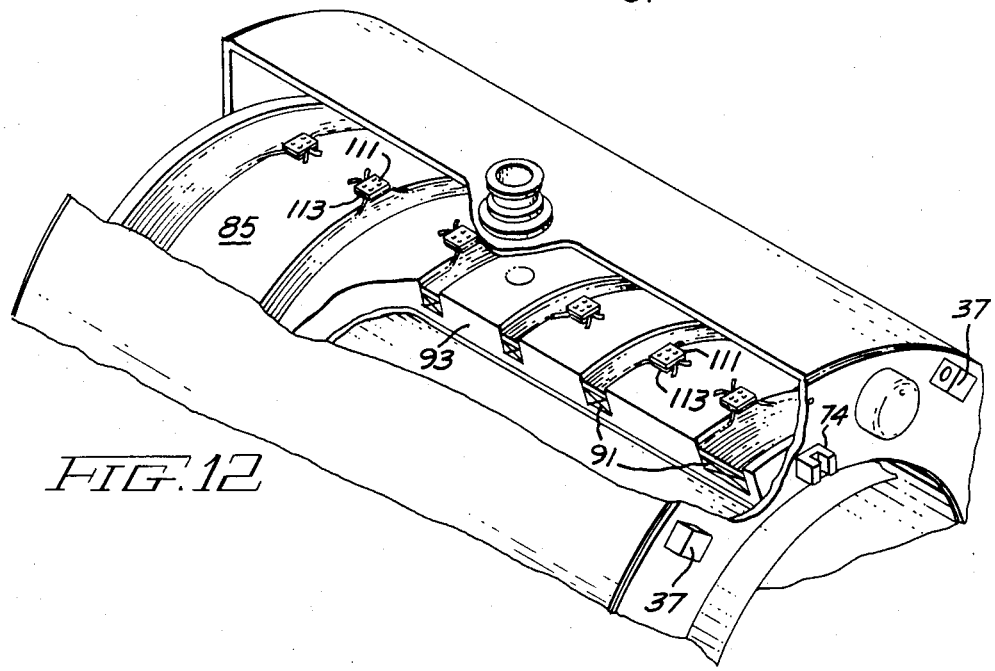
FIG. 12 is a partial cut away sectional view of FIG. 5 showing the superconductor magnet windings in accordance with the present invention.

The superconducting magnet 85 is shown in the helium vessel in FIG. 12. The helium vessel is partially filled with liquid helium through a fill line 87 located on the exterior of the vacuum vessel and shown in FIG. 1. The fill port 86 is coupled to a fill line 87 which extends through the 80K shield, 20K shield and into the lower portion of the helium vessel as seen in FIGS. 3, 4 and 5, respectively. Referring again to FIG. 12, a winding of superconductor wire 91 is wound under tension directly around the outside of a nonmagnetic cylindrical coil form 93 in which grooves have been machined to receive discrete main coils. Six discrete main coils are shown in FIG. 12. The form is preferably fabricated from fiberglass. The number of coils provided depends on the field uniformity over a given imaging volume desired in the bore of the magnet, with more coils required to attain higher field uniformity. Because of the simplicity of machining grooves in a fiberglass form compared to changing castings or forgings, the magnet field homogeneity in the bore of the magnet could easily be improved by increasing the number of coils with little incremental manufacturing costs.

The main coils are preferably wound sequentially from one end of the form to the other, with the coils connected in series, but more complex winding sequences can easily be accommodated. Referring now to FIGS. 12–15, the circumferential grooves are lined with a thin film of friction reducing material such as polytetrafluoroethylene (PTFE) tape 95, 0.005–0.010 inches thick, to provide a low friction interface between the windings of superconductor wire 91 and the coil form. Alternatively, PTFE or molydisulfide coating can be applied on the coil form surfaces in contact with the superconductor wire.

The superconductor wire is a bare wire of typically rectangular cross sectional area which can comprise superconductor filaments embedded in a copper matrix. The superconductor wire is electrically insulated by a spiral wrap of heat resistant aromatic polyamide fiber lacing tape, such as Nomex lacing tape 95 with about 50% coverage. Half of the wire surface is then in contact with the liquid helium during magnet operation, so as to be cooled by nucleate pool boiling. Stability of the superconductor is determined by the heat dissipated to the liquid helium as the current is transferred from the superconductor filaments to the copper matrix in the event of frictional heating that results from wire motion.

When the magnet is energized, the electromagnetic loading on each coil comprises a radially outward force combined with an axial force that attracts the coil to the magnet midplane. The coil axial forces are supported by the shoulders of the circumferential grooves. The radial forces are partly supported by the hoop tension in the superconductor wire and mostly by a stainless steel wire overwrap 97. The wire overwrap is separated from the outside surface of the coils by a thin sheet 101 of high dielectric strength material which retains its properties at liquid helium temperatures. Fiberglass sheet or laminated plastic can be used as the dielectric material. The sheet 101 has axial grooves 103 machined in the surface facing the coil prior to placing the sheet in place. The sheet can be applied as two or three circumferential pieces. A PTFE liner 105 is used as before on the sheet 101 surface that comes in contact with the superconductor wire 91. Sheets 101 are spaced axially from the walls of the coil grooves by radially extending spacers 107 which provide vent passageways between adjacent spacers for the axial grooves of sheet 101. The spacers 107 comprise fiberglass material. The axial grooves in sheet 107 vent the helium vapor from inside the coil to the vent passageways between adjacent spacers in the event of a magnet quench.

The overwrap 97 is wound under tension not only to provide support of the superconductor wire 91 in normal operation but also to restrain the superconductor turns from buckling and jumping over each other as a result of transient heating during a magnet quench. For example in a 0.5T magnet with a coil form having an inner diameter of $46\frac{1}{2}''$ and an outside diameter of $50\frac{1}{2}''$ the superconductor windings were wound with a 30 lb. tension while the overwrap was wound with a 40 lb. tension.

Since the fiberglass form 93 has a lower modulus of elasticity compared to the superconductor 91 and the overwrap 97, it is possible to sufficiently tension the superconductor and overwrap so as to prevent detachment of the coils from the form when the electromagnetic loading is applied. Also, the fiberglass form is wound to have lower thermal contraction circumferentially than both superconductor and overwrap by controlling the directions in which the fibers in the form are wrapped. The fiberglass form was wound on a mandrel using E glass fiberglass filaments wet with epoxy. A winding pattern of a layer of circumferential winding forming a 90° loop followed by four layers, each layer consisting of a layer at plus 45° and a layer at minus 45° followed by a layer of circumferential windings followed by four layers of plus and minus 45° and so on was used until the desired thickness was achieved. As a result, the winding and overwrap tensions increase at lower temperature to further prevent coil to form separation when the superconducting magnet is energized.

Since the overwrap is electromagnetically closely coupled to the coils, a significant portion of the coil energy during a quench is dissipated by circulating currents in the overwrap. Thus, the coil overwrap functions as a magnet protection circuit during a quench. To provide a uniform distribution of induced current in the overwrap circuit during a quench, the start and finish leads must be shorted electrically as shown in FIG. 12 between the two plates 111 and 113 secured to the form. The plates, which are fabricated from nonmagnetic material such as brass, firmly compress the two crossed ends of the wire overwrap in performed grooves smaller than the wire diameter. The plates 111 and 113 are clamped to one another by threaded fasteners. The stainless steel overwrap for each main coil forms the electrical circuit equivalent of a single shorted turn.

With an integral shield, the outer cryostat vessel 13 serves as the ferromagnetic shield of the MR magnet. Since the geometry of the cryostat is determined by the cryogenic and vacuum requirements, the superconducting main windings have to be synthesized for maximum field homogeneity in the presence of the ferromagnetic shield. Referring now to FIG. 16 a section of the shield 13 is shown relative to the position of the main coils 91 and the volume in the center of the bore where high field uniformity is desired. The nonmagnetic radiation shields 17 and 21, the helium vessel 23 and supports are not shown since their presence does not affect the magnetic field determinations. The steps for making an integrally shielded magnetic resonance magnet where the outer cryostat vessel serves as a ferromagnetic shield is shown in FIG. 17. First, as shown in block 123 the shield configuration is determined based on cryostat and vacuum requirements of the cryostat outer vacuum vessel. An initial approximation of the number of main coils, their axial and radial position and number of ampere-turns for a magnet having the desired field strength is chosen in block 125. The initial approximation can be an air core design for a magnet of the same field strength. A finite element analysis of the main coils and the iron shield is performed in block 131 by a finite element algorithm on a computer such as a VAX manufactured by Digital Equipment Company, to determine the axial magnetic flux density at various points of interest in the volume of high uniformity in the bore of the magnet, shown as volume 127 in FIG. 16. The finite element algorithm also determines the magnetization of the iron shield. The peak parts per million (ppm) error between various points in the volume of high uniformity of the axial magnetic flux density is checked in decision block 133 to see if there is any improvement. If the PPM error has not reached a minimum value, a spherical harmonics series expansion of the shield magnetization is performed in block 135 to determine the shield axial magnetic flux density contribution at each point of interest in the volume of high field uniformity 127. The axial magnetic flux density contribution of the shield is subtracted from the specified axial magnetic flux density to determine the desired contribution due to the coils. The desired contribution is not the actual contribution of the coils since the specified axial magnetic flux density 0.5 Tesla, for example, rather than the axial magnetic flux density determined by the finite element analysis is used. The main coil design is modified in block 137 to take into account the approximation of the iron contribution determined by subtracting the calculated iron contribution from the specified field axial magnetic flux density. The synthesis of the coils is performed using an iterative Newton-Raphson procedure. The degrees of freedom in the synthesis are the number of coil pairs times two, since each coil pair is allowed two degrees of freedom, variable axial location and ampere-turns but fixed radial location, or fixed ampere-turns but variable axial location and radial locations. For example, a six coil magnet has six degrees of freedom. The axial magnetic flux density, $B_Z$ at any given point in space is computed by using the Biot-Savart law. To obtain a uniform field within the volume of interest, a number of points equal to the number of points equal to the number of degrees of freedom are chosen within the volume of interest, and the axial flux density is specified at these points. Then the coil pair parameters of axial location and ampere-turns with fixed radial location or fixed ampere-turns but variable axial location and radial location, as desired, are determined using the Newton-Raphson procedure. Once the resynthesis of the coils has been accomplished using appropriate algorithms on a computer, finite element analysis of the coils and the fixed iron shield geometry is again performed in block 131. The contribution of the iron is again approximated and the coils resynthesized until there is no further improvement in the peak part per million of the field computed in the volume of interest as determined in decision block 133, when the finite element analysis is applied to the resynthesized coils and fixed iron-shield geometry. The next step in block 141 is to fabricate the coils according to the latest re-synthesis and then, as shown in block 143, position the coils in the integral shield.

Figure 18:
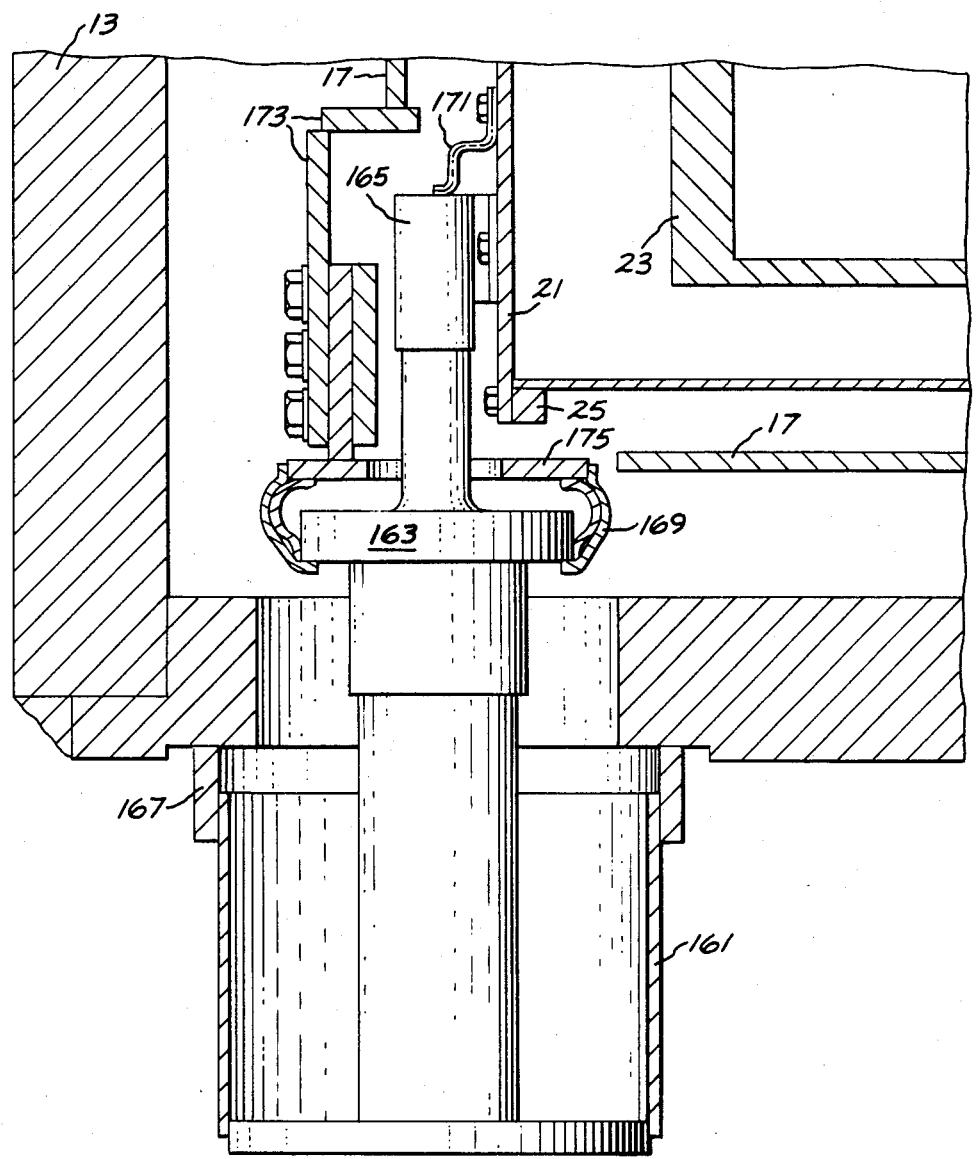
FIG. 18 is a sectional view of the cryostat showing the cryocooler interface.

Referring now to FIGS. 1, 3, 4 and 5, the 20K and 80K shields are cooled by the evaporation of helium from the helium vessel 23. The helium vessel is vented outside the vacuum vessel through a vent 155 after absorbing heat while travelling in a serpentine path which causes the vent piping 157 to pass circumferentially around each of the shields while moving axially back and forth, before reaching the outside of the cryostat. The fill and vent piping are not shown in FIGS. 6 and 7. Referring now to FIGS. 1 and 18 additional cooling is provided by a two stage cryocooler. The housing 161 of the cryocooler with the internal workings removed is shown. During operation the two stage cryocooler is coupled to the two shields 17 and 21 to improve the thermal performance of the cryostat 11. The cryocooler mounting is shown situated near one end of the vacuum vessel near the base, but any orientation is possible, making system integration easier. The cryocooler is coupled to the cryostat using a direct connect interface. The cold head housing of the cryocooler comprises two heat stations, 163 and 165, which, with the cryocooler installed, maintains a temperature of 80K and 20K, respectively. The cold head housing is mounted directly in the vacuum space of the cryostat 11. A flange 167 on the cryocooler housing 161 is welded to the vacuum vessel so that the cold end is located in the cryostat vacuum. The heat stations 163 and 165 on the cryocooler housing are connected directly to the thermal radiation shields 17 and 21, through flexible braided copper cables 169 and 171, respectively, which are sized to minimize thermal resistance while providing for relative motion between the shields and the cryocooler cold head housing during magnet shipment and as a result of thermal contraction.

One end of the braided cable 171 is welded to the heat station 165 of the cryocooler and the other end of the braided cable is bolted onto the shield 21. Therefore, the total thermal interface resistance consists of a resistance due to the weld, the braided cable and the bolted joint. Use of electron beam welding essentially fuses the braid of the copper to the heat station eliminating any thermal contact resistance. To accommodate the cold end housing a portion of the 80K shield was modified by cutting the shield away and welding an adaptor piece 173 to shield 17 which allows room for the insertion of the cold end. The heat station 163 is welded to cable 169. Cable 169 is welded to a ring shaped adaptor 175 which is bolted to adaptor 173. The braided cable 171 used in the preferred embodiment is made from a small wire size (AWG 36) to provide the required flexibility and ratio of length to effective cross sectional area of the copper to maximize the thermal conductance. The pressure between the shield and the braid at the bolted joint can be increased simply by increasing the number of bolts. Thus the thermal performance of the interface can be controlled at minimal cost and with no added complexity.

By using a common vacuum between the cryostat and the cryocooler and by welding the flange on the cryocooler housing to the vacuum vessel, the potential for vacuum leakage is minimized. The helium vessel provides a large cryopump surface which freezes any air or moisture in the vacuum space which helps maintain a high vacuum in the cryostat and therefore in the cryocooler. When cryocooler repair or servicing becomes necessary, the cryocooler inner workings can be removed from the housing 161 without breaking the vacuum.

During assembly of the cryostat the axial support straps are each looped over one of the trunnions with capping flanges 67. The heat stationing straps 71 are affixed to the 20K shield. The helium vessel 23 containing the magnet 85 is positioned inside the two shields 17 and 21 which are within the vacuum vessel 13. The 80K vessel is wrapped with multilayer insulation 177 which can be seen in FIGS. 9 and 10. The circular ends of the shields and the vacuum vessel are not yet in place. The radial support straps 31 with the heat stationing straps affixed are inserted through the openings in the vacuum vessel and retained by spherical supports 45. The radial straps extend through openings in the 80K and 20K shields and the straps are affixed to blocks 37 which are welded to the helium vessel circular faces. The tension of the radial support straps is adjusted and the helium vessel is centered in the vacuum vessel. Since the present design allows direct observation of the helium vessel, positioning is easier and more certain than in support systems where the helium vessel is enclosed by surrounding cylinders, and probes have to be used to ascertain the helium vessel position. Tubular struts 75 are affixed to blocks 74 on the helium vessel and pass through the 20K shield and are secured at their other end to the 80K shield. The heat stationing straps 51 and 53 of the radial support straps 31 are secured to the 20K and 80K shields. The heat stationing straps 76 of the tubular struts are secured to the 20K shield. The openings in the shields through which the radial straps pass are closed by a thin sheet of heat reflective material 181 such as aluminized Mylar.

The axial strut 77 is secured to one circular end of the helium vessel. The circular end plates of the 20K shield are affixed to the ring 25 by screws 27 with the radial straps extending through apertures in the circular ends and the axial struts 77 extending through one of the circular ends. The heat stationing cables 79 are secured to the 20K shield. The sheets of heat reflective material 181 are placed around each of the straps passing through the 20K shield. The spacer blocks 83 are secured to the inside of the 80K shield and plates 80 are attached thereto. Braided cable 171 which is welded to the heat station 165 of the cryocooler is bolted to the 20K shield 21.

The 80K circular shield ends covered with multilayer insulation 177, are secured on either end of the 80K shield. The axial strut 77 is secured to the axial support cover 78. The heat stationing cables 73 of the axial support straps 55 are secured to the 80K circular shield ends. The adaptor piece 175 of the cryocooler interface is secured in place. The circular ends of the vacuum vessel are welded in position and the tension of the axial support straps is adjusted. The covers 65 and 47 are welded in place and the vacuum vessel can then be evacuated.

The radial and axial composite strap support system used in the present invention is designed to achieve its design tension when the helium vessel is filled with liquid helium and the 20K and 80K shields are at their normal operating temperatures. The cryostats are shipped cold and with the vacuum vessel evacuated. However, during operation in the field a failure of the cryostat can occur requiring the cryostat to be returned to the factory. The composite strap support system can function to support the vessels even when the cryostat is not at operating temperatures and the fatigue loading should not adversely affect the design life of the support system.

The suspension system for the shields allows easier assembly with plates simply locked in place by bolting without the need for any tension adjustments.

The orientation of the radial support straps relative to one another is important. However, the strap configuration as a whole can be rotated about the longitudinal axis as long as symmetry between two axes 90° apart (which are not necessarily the vertical and horizontal axes) which are each perpendicular to the axial centerline of the cryostat is maintained.

The foregoing has described an axial strap suspension system for a magnetic resonance magnet which is sufficiently strong to withstand shipping loads yet has few parts. The axial strap suspension system accommodates manufacturing tolerance stackup error and provides improved fatigue loading cycle performance.

While the invention has been described with respect to a preferred embodiment thereof, it will be apparent that certain modifications and changes can be made without departing from the spirit and the scope of the invention. It is therefore, to be understood that the appended claims are intended to cover all such modifications and changes as fall within the true spirit of the invention.

What we claim is:

1. A cryostat comprising:
   an outer closed cylindrical vacuum vessel;
   an inner cylindrical helium vessel situated inside said vacuum vessel, said helium vessel having on its outside surface four radially extending trunnions situated on a horizontal plane passing through the center of the helium vessel, said trunnions symmetrically spaced on either side of the helium vessel, about the helium vessel's axial midplane; and
   four straps, one end of each of said straps looping about a respective one of said four trunnions, the other end of each of said straps rotatably secured to the circular end faces of said vacuum vessel, with two straps from the trunnions closest to an end face secured to that end face.

2. The cryostat of claim 1 wherein said straps comprise unidirectional dominated fiber reinforced plastic.

3. The cryostat of claim 1 wherein said trunnion further comprises a capping flange.

4. The cryostat of claim 1 wherein said straps are axially adjustably secured to the circular end faces of the vacuum vessel by a clevis, holding a pin about which the strap passes, a threaded rod engages the clevis and extends through the circular end face of the vacuum vessel.

5. The cryostat of claim 1 wherein said vacuum vessel is fabricated of ferromagnetic material.

6. A magnetic resonance cryostat comprising:
   an outer closed cylindrical vacuum vessel;
   two nested cylindrical radiation shields;
   a helium vessel nested inside said radiation shields said helium vessel having on its outside surface four radially extending trunnions situated on a horizontal plane passing through the center of the helium vessel, said trunnions symmetrically spaced on either side of the helium vessel about the vessel's axial midplane,
   four straps one end of each of said straps looping about a respective one of said four trunnions, the other end of each of said straps rotatably secured to the circular end faces of said vacuum vessel, with two straps from the trunnions closest to an end face secured to that end face; and
   heat stationing connectors secured to each of said component straps to connect a predetermined section along the length of the straps to each of the radiation shields, so that heat flow from the vacuum vessel can be intercepted before reaching the helium vessel.

7. The magnetic resonance cryostat of claim 6 wherein said heating stationing connectors comprise braided metal cables secured to said composite straps by heat conductive epoxy and secured to said radiation shields by threaded fasteners.

8. The cryostat of claim 6 wherein said straps comprise unidirectional dominated fiber reinforced plastic.

9. The cryostat of claim 6 wherein said trunnion further comprises a capping flange.

10. The cryostat of claim 6 wherein said straps are axially adjustably secured to the circular end faces of the vacuum vessel by a clevis, holding a pin about which the strap passes, a threaded rod engages the clevis and extends through the circular end face of the vacuum vessel.

11. The cryostat of claim 6 wherein said vacuum vessel is fabricated of ferromagnetic material.

* * * * *